(12) United States Patent
Mitrovic et al.

(10) Patent No.: US 10,570,510 B2
(45) Date of Patent: Feb. 25, 2020

(54) PERIPHERY PURGE SHUTTER AND FLOW CONTROL SYSTEMS AND METHODS

(71) Applicant: Veeco Instruments Inc., Plainview, NY (US)

(72) Inventors: Bojan Mitrovic, Somerset, NJ (US); Eric Armour, Pennington, NJ (US); Ian Kunsch, Somerset, NJ (US)

(73) Assignee: Veeco Instruments Inc., Plainview, NY (US)

( * ) Notice: Subject to any disclaimer, the term of this patent is extended or adjusted under 35 U.S.C. 154(b) by 310 days.

(21) Appl. No.: 15/448,019

(22) Filed: Mar. 2, 2017

(65) Prior Publication Data

US 2017/0253967 A1  Sep. 7, 2017

Related U.S. Application Data

(60) Provisional application No. 62/302,413, filed on Mar. 2, 2016.

(51) Int. Cl.
| | |
|---|---|
| *C23C 16/44* | (2006.01) |
| *C23C 16/455* | (2006.01) |
| *H01L 21/687* | (2006.01) |
| *C23C 16/458* | (2006.01) |
| *H01L 21/02* | (2006.01) |

(52) U.S. Cl.
CPC ...... *C23C 16/4401* (2013.01); *C23C 16/4584* (2013.01); *C23C 16/4588* (2013.01); *C23C 16/45504* (2013.01); *C23C 16/45519* (2013.01); *H01L 21/0262* (2013.01); *H01L 21/02546* (2013.01); *H01L 21/68764* (2013.01); *H01L 21/68771* (2013.01)

(58) Field of Classification Search
None
See application file for complete search history.

(56) References Cited

U.S. PATENT DOCUMENTS

| | | | |
|---|---|---|---|
| 5,884,009 A | * 3/1999 | Okase | H01L 21/67017 219/405 |
| 2009/0238971 A1 | * 9/2009 | Higashi | C23C 16/45591 118/724 |

(Continued)

OTHER PUBLICATIONS

Webpage, "Veeco Launches K475i As/P MOCVD System with Highest Productivity and Best-in-Class Yields," dated Feb. 18, 2016, 2 pages.

(Continued)

*Primary Examiner* — Binu Thomas
(74) *Attorney, Agent, or Firm* — Patterson Thuente Pedersen, P.A.

(57) ABSTRACT

An arrangement of two shutters radially outward from an injector block and a susceptor onto which a wafer carrier is removably mounted are configured to provide a flowpath through a reactor chamber that does not exhibit a vortex, thereby reducing or eliminating buildup on the inside of the reactor chamber and facilitating large temperature gradient between the injector block and the wafer carrier. This can be accomplished by introduction of a purge gas flow at a radially inner wall of an upper shutter, and in some embodiments the purge gas can have a different chemical composition than the precursor gas used to grow desired epitaxial structures on the wafer carrier.

9 Claims, 17 Drawing Sheets

(56) References Cited

U.S. PATENT DOCUMENTS

| | | | |
|---|---|---|---|
| 2011/0027480 A1* | 2/2011 | Han | C23C 16/45565 118/715 |
| 2012/0171870 A1* | 7/2012 | Mitrovic | C23C 16/45591 438/706 |
| 2014/0116330 A1* | 5/2014 | Belousov | C23C 16/45574 117/98 |
| 2015/0075431 A1 | 3/2015 | Barriss et al. | |

OTHER PUBLICATIONS

Webpage, "TurboDisc K475i As/P MOCVD System," dated Feb. 18, 2016, 2 pages.
Webpage, "TurboDisc® K475i™ As/P MOCVD System for LED Production," dated Feb. 18, 2016, 2 pages.

* cited by examiner

PERIPHERY PURGE SHUTTER AND FLOW CONTROL SYSTEMS AND METHODS

RELATED APPLICATION

This application claims the benefit of U.S. Provisional Application No. 62/302,413 filed Mar. 2, 2016, which is hereby fully incorporated herein by reference.

TECHNICAL FIELD

Embodiments describe herein relate to apparatuses and methods for chemical vapor deposition (CVD) such as metalorganic chemical vapor deposition (MOCVD). In particular, novel flow patterns are facilitated by shutter arrangements and flowpaths in the reactor chamber that improve CVD growth uniformity and quality.

BACKGROUND

Chemical vapor deposition (CVD) is a process that can be used to grow desired objects epitaxially. Examples of current product lines of manufacturing equipment that can be used in CVD processes include the TurboDisc®, MaxBright®, and EPIK™ family of MOCVD systems, manufactured by Veeco Instruments Inc. of Plainview, N.Y.

A number of process parameters are controlled, such as temperature, pressure and gas flow rate, to achieve a desired crystal growth. Different layers are grown using varying materials and process parameters. For example, devices formed from compound semiconductors such as III-V semiconductors typically are formed by growing successive layers of the compound semiconductor using metal organic chemical vapor deposition (MOCVD). In this process, the wafers are exposed to a combination of gases, typically including a metal organic compound as a source of a group III metal, and also including a source of a group V element (for example, arsenic or phosphorus) which flow over the surface of the wafer while the wafer is maintained at an elevated temperature. Generally, the metal organic compound and group V source are combined with a carrier gas which does not participate appreciably in the reaction as, for example, nitrogen, or hydrogen. One example of an III-V semiconductor is indium phosphide (InP), which can be formed by reaction of indium and phosphine or aluminum gallium arsenide ($AlGa_{1-x}As_x$), which can be formed by the reaction of aluminum, gallium, and arsine. The reaction of the compounds form a semiconductor layer on a substrate having a suitable substrate. These precursor and carrier gases can be introduced by an injector block configured to distribute the gas as evenly as possible across the growth surface.

The wafer is usually maintained at a temperature on the order of 500-1200° C. during deposition of precursor gases and related compounds. The precursor gases, however, are introduced to the chamber at a much lower temperature, typically 200° C. or lower. Thus, as the precursor gases approach the wafer, their temperature increases substantially. Depending on the precursor gases used in deposition of the particular wafer under construction, pyrolyzation of the precursor gases can occur at an intermediate temperature between that of the input gases and the wafer. This pyrolyzation facilitates the interaction of the precursor gases and growth of the crystal structure.

In a MOCVD process chamber, semiconductor wafers on which layers of thin film are to be grown are placed on rapidly-rotating carousels, referred to as wafer carriers, to provide a uniform exposure of their surfaces to the atmosphere within the reactor chamber for the deposition of the semiconductor materials. Rotation speed is on the order of 1,000 RPM. The wafer carriers are typically machined out of a highly thermally conductive material such as graphite, and are often coated with a protective layer of a material such as silicon carbide. Each wafer carrier has a set of circular indentations, or pockets, in its top surface in which individual wafers are placed.

In some systems, the wafer carrier can be supported on a spindle within the reaction chamber so that the top surface of the wafer carrier having the exposed surfaces of the wafers faces upwardly toward a gas distribution device. While the spindle is rotated, the gas is directed downwardly, along an increasing temperature gradient, onto the top surface of the wafer carrier and flows across the top surface toward the periphery of the wafer carrier. The used gas is evacuated from the reaction chamber through ports disposed below the wafer carrier. The wafer carrier is maintained at the desired temperature and pressure by heating elements, typically electrical resistive heating elements disposed below the bottom surface of the wafer carrier. These heating elements are maintained at a temperature above the desired temperature of the wafer surfaces, whereas the gas distribution device typically is maintained at a temperature well below the desired reaction temperature so as to prevent premature reaction of the gases. Therefore, heat is transferred from the heating elements to the bottom surface of the wafer carrier and flows upwardly through the wafer carrier to the individual wafers. In other embodiments, the wafer carrier can be supported and rotated by a rotation system that does not require a spindle. Such a rotation system is described in U.S. Patent Application Publication No. 2015/0075431, the contents of which are hereby incorporated by reference herein. In yet other embodiments, the wafer carrier holding at least one wafer is placed face down (inverted) in the reaction chamber and the gas distribution device is situated below the wafer carrier such that the process gases flow upwardly towards the at least one wafer.

The precursor gas flow is generally downward (that is, perpendicular) to the surface of a wafer carrier along an increasing temperature gradient until it reaches pyrolyzation temperatures, then impinges upon the wafer surface(s) that are being grown. This permits for the growth of the crystalline structure on the wafer. In most systems, there is additional pyrolyzed gas that flows around the wafer carrier. If this pyrolyzed gas is not removed from the reactor, buildup of undesirable materials on surfaces can occur. Such buildup can build up on the reactor, or occasionally and unpredictably flake off, falling onto the wafer being grown. These events can damage the reactor or epitaxial layers being grown on the wafers. Therefore, pyrolyzed gas is conventionally removed from the reactor after passing over the wafer. Nonetheless, buildup of the pyrolyzed gas has been known to occur in the reactor, in particular on the radially outer portions of the reactor housing.

SUMMARY

A reactor in accordance with the present invention is provided which generates flow patterns for the pyrolyzed gases that do not result in unwanted buildup. This is accomplished, in embodiments, by reducing or eliminating the vortex flow pattern common in conventional systems. For example, in embodiments, a two-part periphery purge system can be used which allows egress of pyrolyzed gas at the radially outer edge of the reactor chamber, between the gas flow input and the plane of the wafer carrier body. In this way, gas flow that has been pyrolyzed and passed across the face of the wafer carrier can be rapidly drawn out of the reactor chamber before building up on any other surface.

Furthermore, the reduction or elimination of a vortex within the reactor chamber results in a higher temperature gradient from the injector block to the susceptor. This can be beneficial for preventing buildup of undesirable materials. Furthermore, by precisely controlling the temperature gradient and flowpath, greater uniformity of epitaxial layers grown on wafers can be achieved.

In various embodiments, reduction or elimination of a vortex within the reactor chamber is accomplished by either structural arrangements of shutters, modifications to flow rates of precursor gas and/or purge gas, or modification of the chemical composition of the purge gas, in embodiments. In some embodiments, more than one of these may be used in concert to achieve a desired flowpath.

In an embodiment, a reactor for use with a chemical vapor deposition (CVD) system can include a wafer carrier extending radially outward from an axis and defining a top surface, an injector block configured to provide a precursor gas flow to the top surface of the wafer carrier, an upper shutter arranged radially outward from the wafer carrier and extending parallel the axis from the injector block to the top surface, an inner periphery purge inlet arranged between the upper shutter and the injector block, a lower shutter arranged radially outward from the upper shutter and extending parallel the axis from the upper shutter away from the injector block, and an outer periphery purge inlet arranged radially outward from the upper shutter.

According to another embodiment, a method for operating a CVD system includes heating a wafer carrier having an upper surface, mounting the wafer carrier on a susceptor, rotating the susceptor about an axis, providing a precursor gas to the upper surface via an injector block such that at least a portion of the precursor gas is deposited at the upper surface, providing a purge gas at an inner periphery purge inlet arranged between the injector block and an upper shutter that extends radially about the axis, thereby causing a peripheral gas flow along a radially inner edge of the upper shutter, and providing a lower shutter, arranged radially outward from the upper shutter from the axis, such that an un-deposited portion of the precursor gas as well as the purge gas provided at the inner periphery purge inlet both flow out of the reactor chamber via a gap defined between the upper shutter and the lower shutter.

The above summary of the invention is not intended to describe each illustrated embodiment or every implementation of the present invention. The detailed description and claims that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
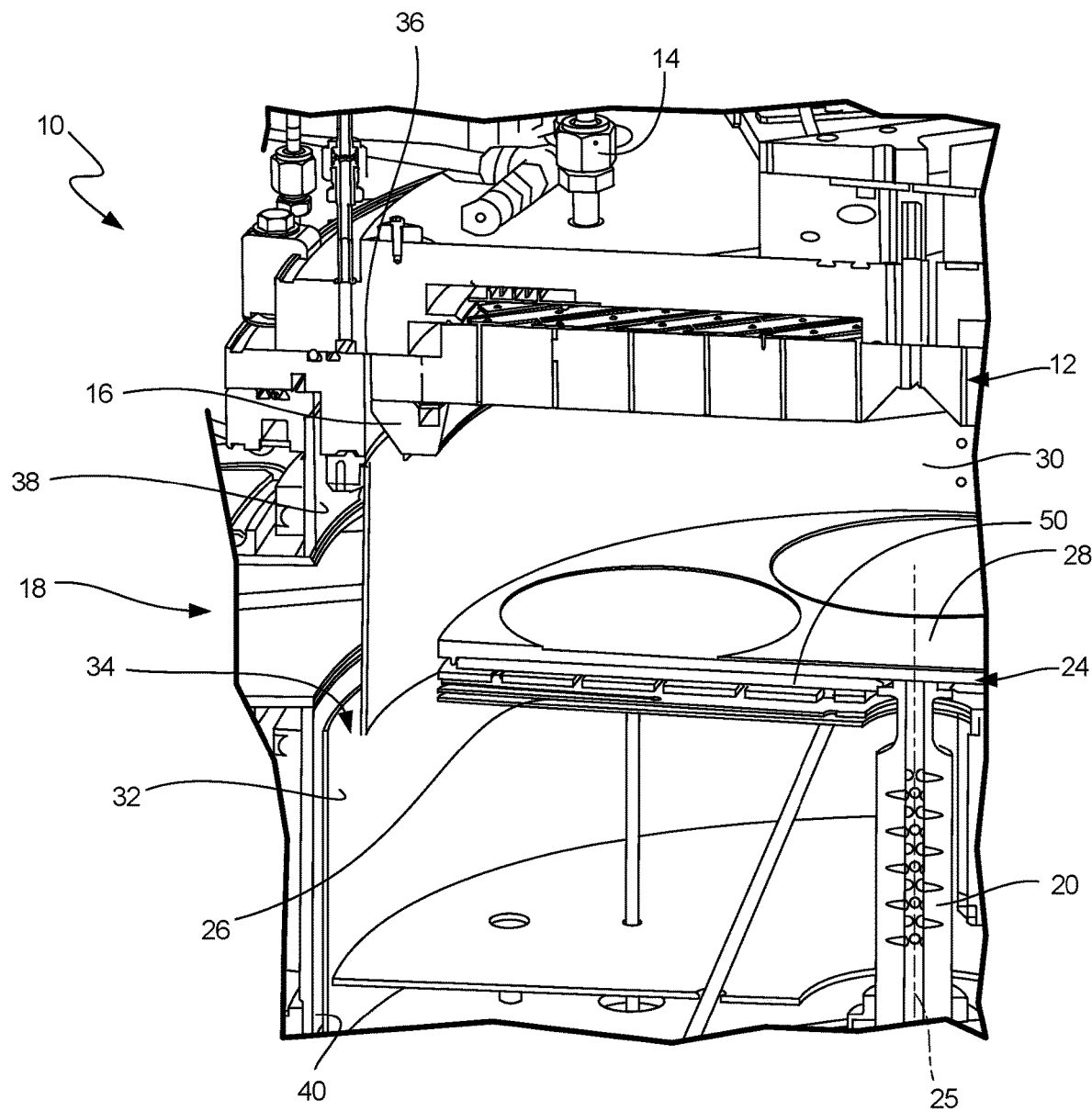
FIG. 1 is a cross-sectional perspective view of a portion of the chemical vapor deposition apparatus, depicting a peripheral purge shutter in accordance with an embodiment.

While embodiments are amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

According to embodiments described herein, a periphery shutter purge is provided for a reactor chamber that improves the uniformity of thickness of wafers grown therein, reduces the potential for incidence of pyrolyzed gases with surfaces other than the growth side of the susceptor, and decreases recirculation of hot and/or pyrolyzed gases back towards the injector block from the susceptor.

FIG. 1 illustrates a chemical vapor deposition apparatus in accordance with one embodiment of the invention. Reaction chamber 10 defines a process environment space. Injector block 12 is arranged at one end of the chamber. The end having injector block 12 is referred to herein as the "top" end of reaction chamber 10. This end of the chamber typically, but not necessarily, is disposed at the top of the chamber in the normal gravitational frame of reference. Thus, the downward direction as used herein refers to the direction away from injector block 12; whereas the upward direction refers to the direction within the chamber, toward injector block 12, regardless of whether these directions are aligned with the gravitational upward and downward directions. Similarly, the "top" and "bottom" surfaces of elements are described herein with reference to the frame of reference of reaction chamber 10 and injector block 12.

Injector block 12 is connected to precursor gas source 14 for supplying process gases to be used in the wafer treatment process, such as a carrier gas and reactant gases, such as a metalorganic compound and a source of a group V metal. Injector block 12 is arranged to receive the various gases and direct a flow of process gases generally in the downward direction. Injector block 12 desirably is also connected to coolant system 16 arranged to circulate a liquid proximate to injector block 12 so as to maintain injector block 12 at a desired temperature during operation. A similar coolant arrangement (not shown) can be provided for cooling the walls of reaction chamber 10. Reaction chamber 10 is also equipped with exhaust system that surrounds rotary pass-through device 22 and is arranged to remove spent gases from the interior of the chamber 10 so as to permit continuous flow of gas in the downward direction from injector block 12.

Spindle 20 is arranged within chamber 10 so that the central axis of spindle 20 extends in the upward and downward directions. Spindle 20 is mounted to chamber 10 by a conventional rotary pass-through device 22 incorporating bearings and seals so that spindle 20 can rotate while maintaining a seal between spindle 20 and the wall of reaction chamber 10.

The top end of spindle 20 is coupled to susceptor 50. Susceptor 50 can be a wafer carrier retention mechanism adapted to releasably engage a wafer carrier 24, in embodiments. Spindle 20 can be connected to a rotary drive mechanism such as an electric motor drive, which is arranged to rotate spindle 20 at the desired speed to cause susceptor 50 to rotate as well.

Susceptor 50 has a generally circular cross-section, arranged about central axis 25. In the embodiment shown in FIG. 1, reaction chamber 10, injector block 12, coolant system 16, spindle 20, susceptor 50, and heating element 26 are each arranged such that they are symmetrical about central axis 25. Susceptor 50 is a device upon which a wafer carrier 24 sits. Wafer carrier 24 has one or more pockets into which wafers are held and onto which semiconductor materials can be grown epitaxially.

Heating element 26 is mounted within chamber 10 and surrounds spindle 20 below susceptor 50. In a typical MOCVD process, heating element 26 is actuated, and a rotary drive mechanism operates to turn spindle 20 and hence susceptor 50 and wafer carrier 24 at the desired speed. Typically, spindle 20 is rotated at a rotational speed from about 50-1500 revolutions per minute. Precursor gas source 14 can be actuated to supply gases through injector block 12. The gases pass downwardly toward wafer carrier 24, over top surface 28 of wafer carrier 24, and around the periphery of the wafer(s) grown on the top surface 28 then carried to exhaust system 22. Thus, the top surface of the wafer carrier 24 is exposed to a process gas including a mixture of the various precursor gases supplied by the process gas supply system 14. Most typically, the process gas at the top surface is predominantly composed of a carrier gas. In a typical chemical vapor deposition process, the carrier gas may be hydrogen, and hence the process gas at the top surface of the wafer carrier is predominantly composed of hydrogen, or in some instances, a combination of hydrogen and nitrogen, with some amount of the reactive gas components.

Heating element 26 transfers heat to susceptor 50, principally by radiant heat transfer. In alternative embodiments, it may be possible to heat susceptor 50 by some other mechanism, such as inductive heat transfer. The heat applied to susceptor 50 flows upwardly through the body of wafer carrier 24 to the top surface 28 thereof. Heat is radiated from the top surface 28 to the colder elements of the chamber 10 such as, for example, to the walls of the process chamber and to injector block 12. Heat is also transferred from the top surface 48 of wafer carrier 24 and the top surfaces of the wafers to the process gas passing over these surfaces.

Pyrolyzed precursor gas is desirably removed from chamber 10, prior to accumulating on any of these other colder structures. Condensation occurs more rapidly on cold surfaces. Heating these surfaces, however, can result in unwanted pyrolyzation. The wall structure shown in FIG. 1, formed by upper shutter 30 and lower shutter 32, beneficially provides a downward flow direction, reducing or eliminating any vortex that would otherwise re-circulate hot, pyrolyzed gases back up towards relatively cold surfaces such as injector block 12 to condense.

FIG. 1 also shows structures that remove unused, pyrolyzed precursor gases without causing unwanted recirculation, vorticity, or buildup in locations other than on the wafer carrier. FIG. 1 shows upper shutter 30 and lower shutter 32 defining gap 34 as well as inner periphery purge inlet 36, outer periphery purge inlet 38, and outer periphery purge outlet 40.

As depicted in FIG. 1, there are several inlets for gases into reactor chamber 10. The bulk of the flow of gas into reactor housing 10 comes from injector block 12, which provides the precursor gases necessary to epitaxially grow structures such as wafers upon wafer carrier 24. Additional gas flow into reactor housing 10 is provided on either side of upper shutter 30, and exits reactor housing 10 adjacent to lower shutter 32, which define a gap 34 therebetween.

Inner periphery purge inlet 36 is arranged between injector block 12 and upper shutter 30, at the top of reactor chamber 10. Outer periphery purge inlet 38 is arranged opposite upper shutter 30 from inner periphery purge inlet 36. In embodiments, inner periphery purge inlet 36 and outer periphery purge inlet 38 can extend continuously, in two rings on the upper surface of reactor chamber 10. In other embodiments, one or more of inner periphery purge inlet 36 and outer periphery purge inlet 38 can include multiple point inlets for gas flow rather than a continuous ring.

The positions of inner periphery purge inlet 36 and outer periphery purge inlet 38, radially inside and outside of upper shutter 30, respectively, results in reduced vorticity of the precursor gases in reactor chamber 10. Furthermore, the gases applied at each of the inlets 36 and 38 can be different from one another and/or from the gas input at injector block 12, such that different precursor gas levels can be produced at different regions within reactor chamber 10.

Figure 2:
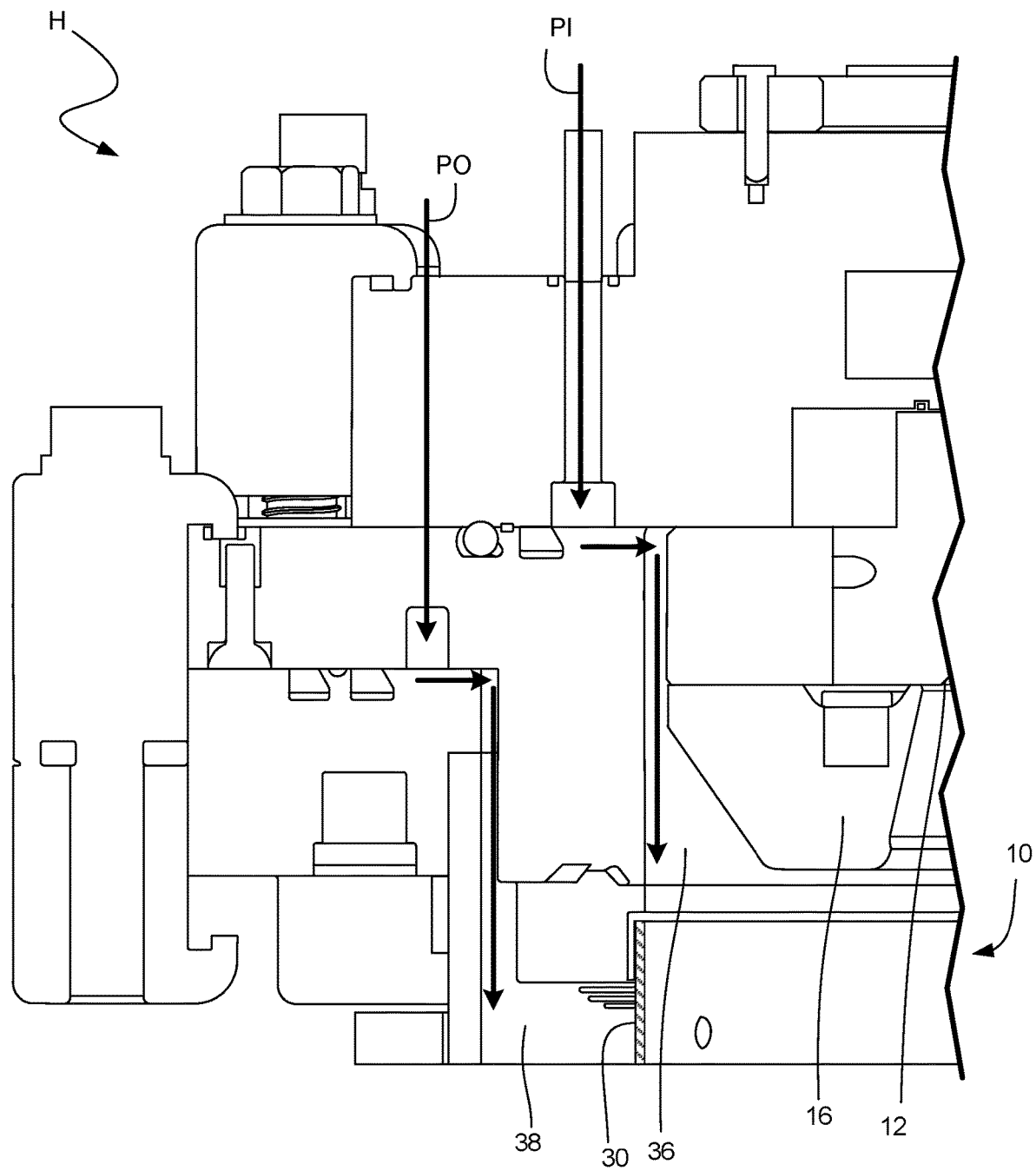
FIG. 2 is a simplified cross-sectional view of a CVD reactor depicting flowpaths for peripheral purge, according to an embodiment.

FIG. 2 is a partial cross-sectional view of a reactor housing H, in particular showing the Peripheral Inner flowpath PI, and the Peripheral Outer flowpath PO. In the embodiment shown in FIG. 3, peripheral inner flowpath PI routes a fluid such as a precursor gas to inner periphery purge inlet 36, and peripheral outer flowpath PO routes a fluid such as a precursor gas to outer periphery purge inlet 38. As previously described with respect to FIG. 1, these flowpaths can be used to form various regions of different precursor gas distributions, and in embodiments the flow rates and gas introduced by peripheral inner flowpath PI and peripheral outer flowpath PO can be different from one another. In embodiments, the flow rates and/or compositions associated with peripheral inner flowpath PI and peripheral outer flowpath PO can be used to control a level of vorticity within reactor chamber 10.

In alternative embodiments, the flowpaths can travel through different paths in housing H than what is shown in FIG. 2. In some embodiments, for example, where the gas composition routed into chamber 10 is the same at both peripheral inner flowpath PI and peripheral outer flowpath PO, a single flowpath can be made through housing H to both the inner periphery purge inlet 36 and the outer periphery purge inlet 38. In embodiments, other components such as flow regulators can be incorporated in order to change the rate at which fluid is introduced to reactor chamber 10, both inside and outside of upper shutter 30, in order to control vorticity and/or regions of different precursor gas composition.

Figure 3A:
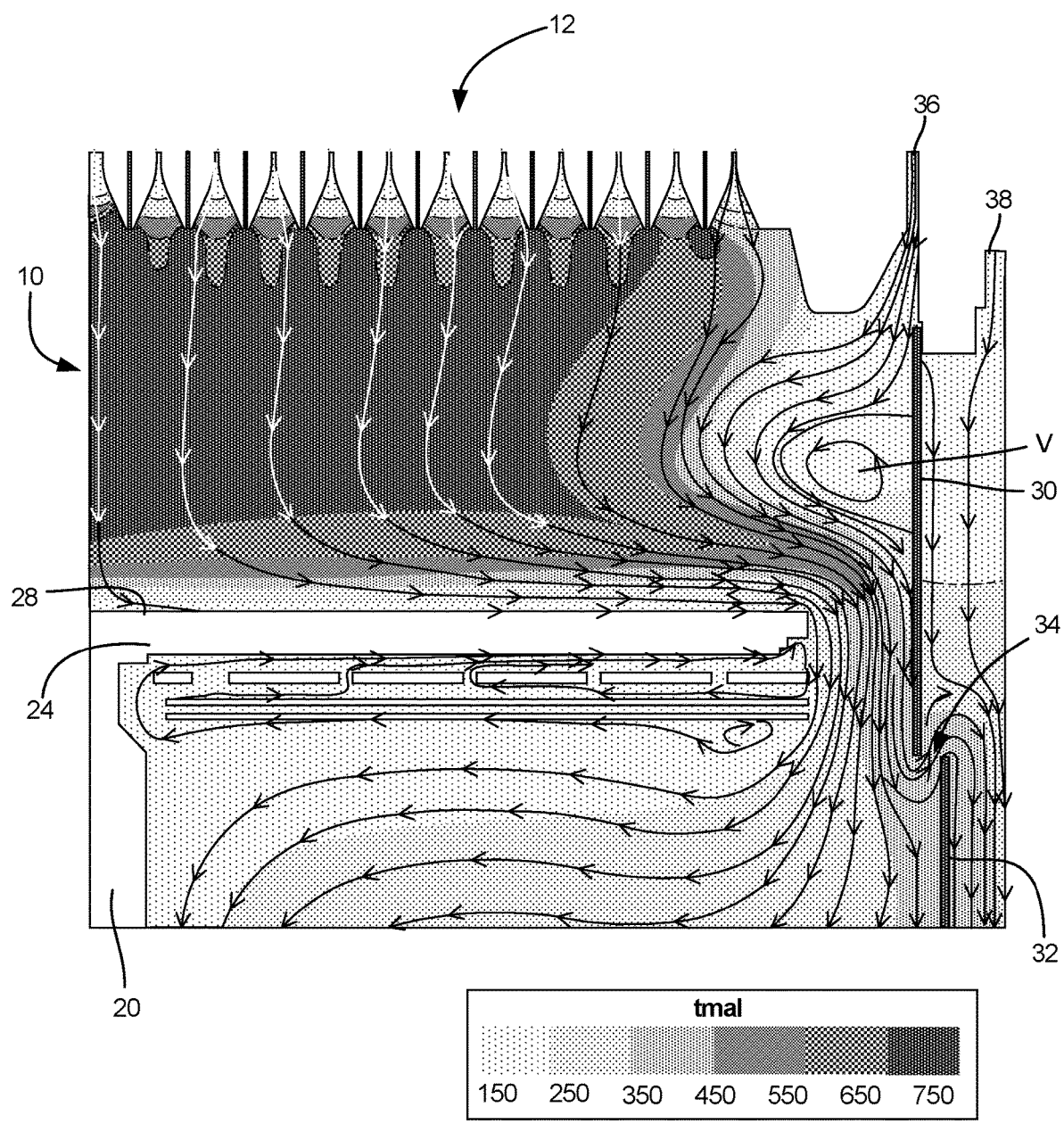
FIGS. 3A-3C are charts corresponding to the chemical compositions and fluid flowlines of gases in a cross-section of a reactor, to three embodiments.
Figure 3B:
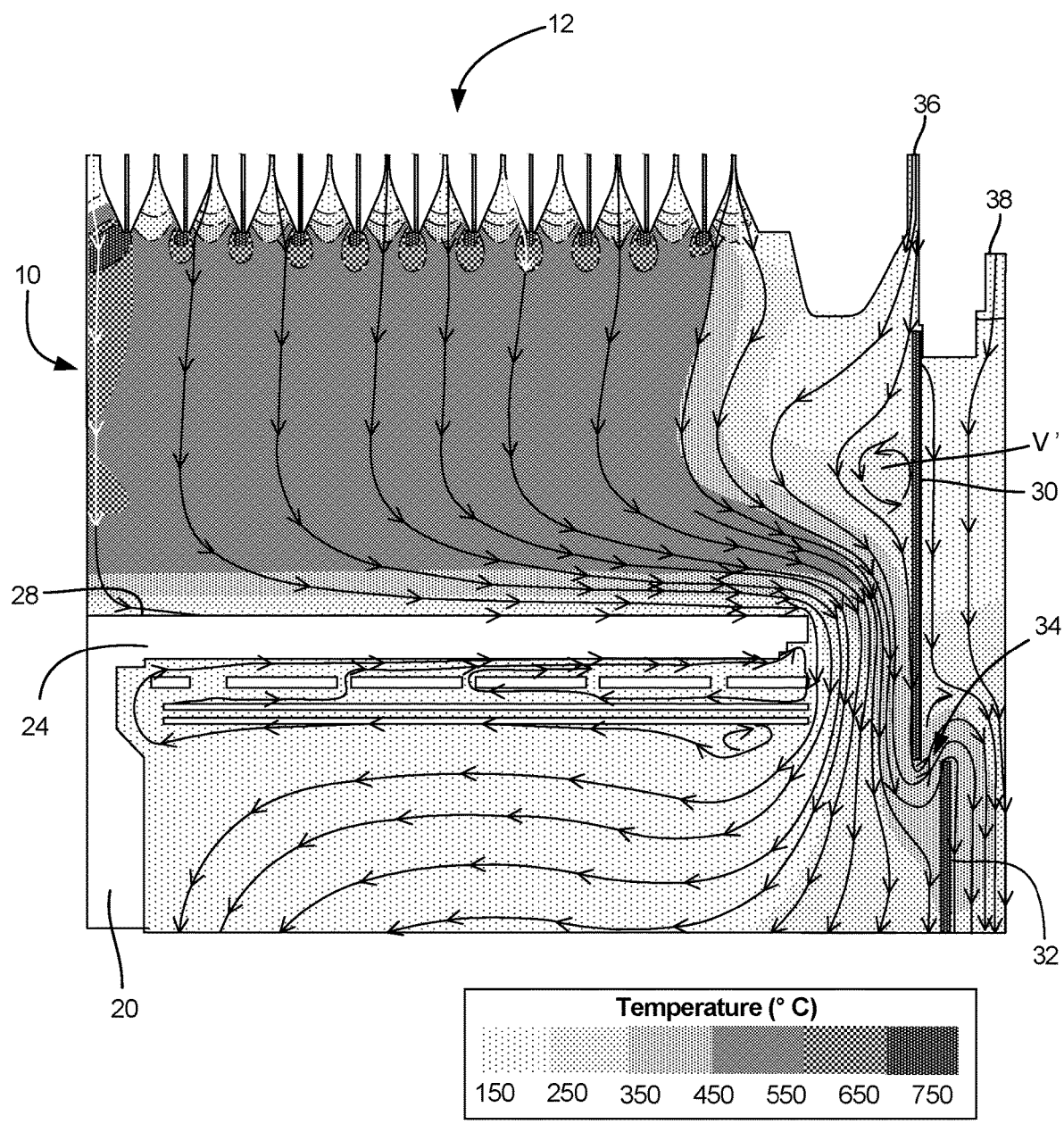
Figure 3C:
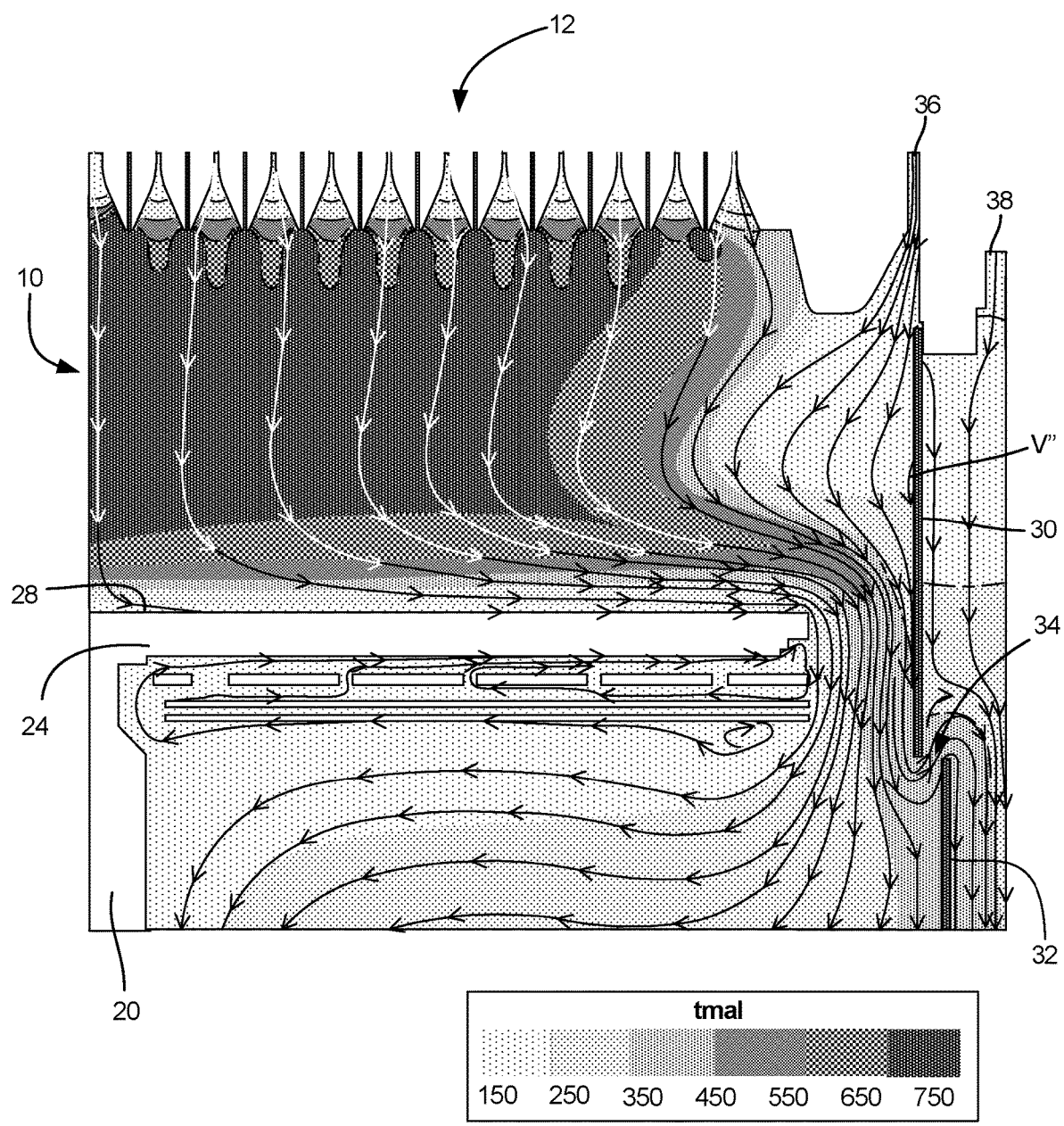

FIGS. 3A-3C depict the flow lines in a chemical vapor deposition process utilizing the precursor gas trimethylaluminum (TMAl). In other embodiments, various other precursor gases, such as trimethyl gallium (TMGa), can also be used. The level of TMAl is shown in each figure as well. As shown in each of FIGS. 3A-3C, the level of TMAl in the precursor gas introduced by injector block 12 is relatively high, while the level of TMAl in the precursor gas introduced at inner periphery purge inlet 36 and outer periphery purge inlet 38 is relatively low, or zero in some embodiments.

FIG. 3A depicts an embodiment in which precursor gases introduced at inner periphery purge inlet 36 are at a relatively low flow rate along the radially inner edge of upper shutter 30. In one embodiment, the flow rate $Q_{total}$ associated with injector block 12 is about 82 standard liters per minute (slm) while the flow rate $Q_{purge}$ associated with inner periphery purge inlet 36 is about 23 slm.

The embodiment shown in FIG. 3A advantageously reduces the amount of vorticity within reactor chamber 10 (shown in this embodiment as vortex V), because the position of gap 34 defined by upper shutter 30 and lower shutter 32 promotes laminar fluid flow across top surface 28 of wafer carrier 24. In conventional systems, radially outward flow could contribute to vorticity, routing hot, pyrolyzed gases upwards and away from wafer carrier 24, where they could deposit upon other surfaces. By positioning gap 34 radially outward and slightly below the top surface 28, such vorticity is reduced as compared with conventional systems.

Furthermore, introduction of additional precursor gas at inner periphery purge inlet 36 reduces the size of vortex V. By modifying the flow rates of precursor gases introduced at inner periphery purge inlet 36 and outer periphery purge inlet 38, a desired flow pattern reducing or eliminating vortex V can be produced.

For example, as shown in FIG. 3B, the size of vortex V' has been significantly reduced as compared to vortex V previously shown in FIG. 3A, due to a change in the flow rates of the precursor and peripheral flow gases. In particular, in the embodiment shown in FIG. 3B, the flow introduced at inner periphery purge inlet 36 along the radially inner edge of upper shutter 30 has been increased from about 23 slm to about 27 slm, whereas $Q_{total}$ has been increased to about 100 slm.

It should be understood that in various embodiments, the flow rates at each of the inner periphery purge inlet 36, the outer periphery purge inlet 38, and the injector block 12 can all be modified depending on the desired level of vorticity within reactor chamber 10, and based on a desired speed of epitaxial growth, an operating temperature, the size and shape of the reactor chamber, and the types of precursor gases being used, for example.

In embodiments, vorticity can be even further reduced by modifying the type of gas input at inner periphery purge inlet 36 along the radially inner edge of upper shutter 30. As shown in FIGS. 3A and 3B, the precursor gases input at inner periphery purge inlet 36 and outer periphery purge inlet 38 contain low quantities of pyrolyzable material, if any, while the precursor gases introduced at injector block 12 contain up to about 1% TMAl. The remainder of the precursor gas can be trimethylgallium (TMGa) and arsine ($AsH_3$) that react with the TMAl to form aluminum gallium arsenic (AlGaAs), in the embodiments shown in FIGS. 3A-3C. In alternative embodiments, other precursor gases can be used to form other epitaxially-grown wafers or structures on surface 28. For example, as previously described, the precursor gases can be selected to grow gallium arsenide or other materials.

In FIG. 3C, the precursor gas provided by inner periphery purge inlet 36 includes a relatively heavier or denser carrier gas component than that provided by injector block 12. In particular, inner periphery purge inlet 36 provides 23 slm $H_2$ and 3 slm $N_2$, for a total inner peripheral carrier gas flow rate through inner periphery purge inlet 36 of about 26 slm. The carrier gas flow rate provided by injector block 12 is about 82 slm $H_2$.

As shown in FIG. 3C, the introduction of a heavier component, $N_2$, into the gas provided by inner periphery purge inlet 36 can result in even more reduction in vorticity than the increased flow rates previously described with respect to FIG. 3B. Thus, the location V" where vortices were present in FIGS. 4A and 4B does not include any vortex in FIG. 3C. By balancing $H_2/N_2$ ratio into periphery purge one can influence all three major components that affect the growth rate at the outer portion of the carrier: Diffusion rate of reactants (D); Concentration of reactants ($C_G$); and Boundary layer thickness (δ), wherein growth rate is proportional to D $C_G$/δ.

Figure 4A:
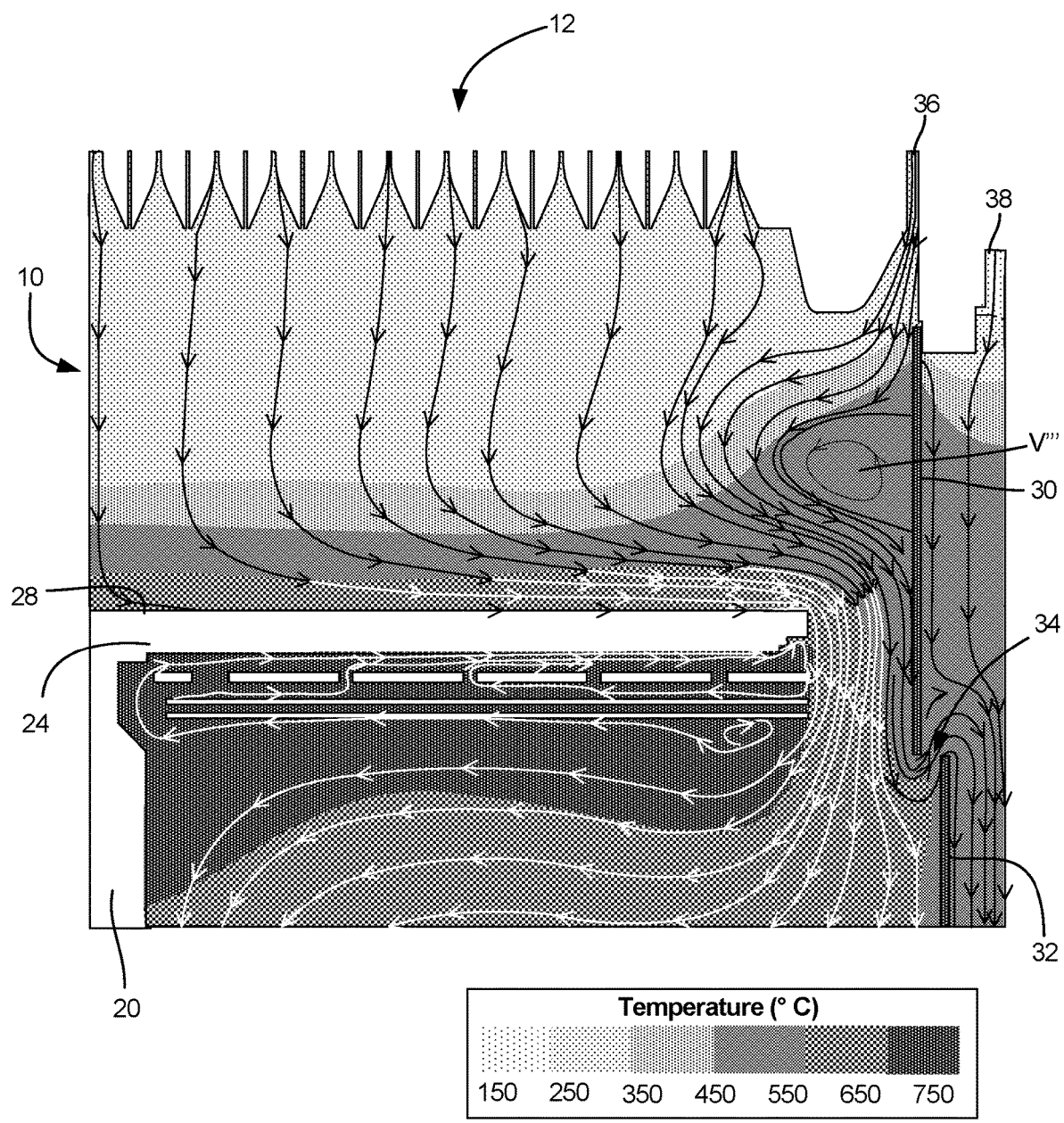
FIGS. 4A and 4B are charts depicting temperature within a reactor housing, according to two embodiments.
Figure 4B:
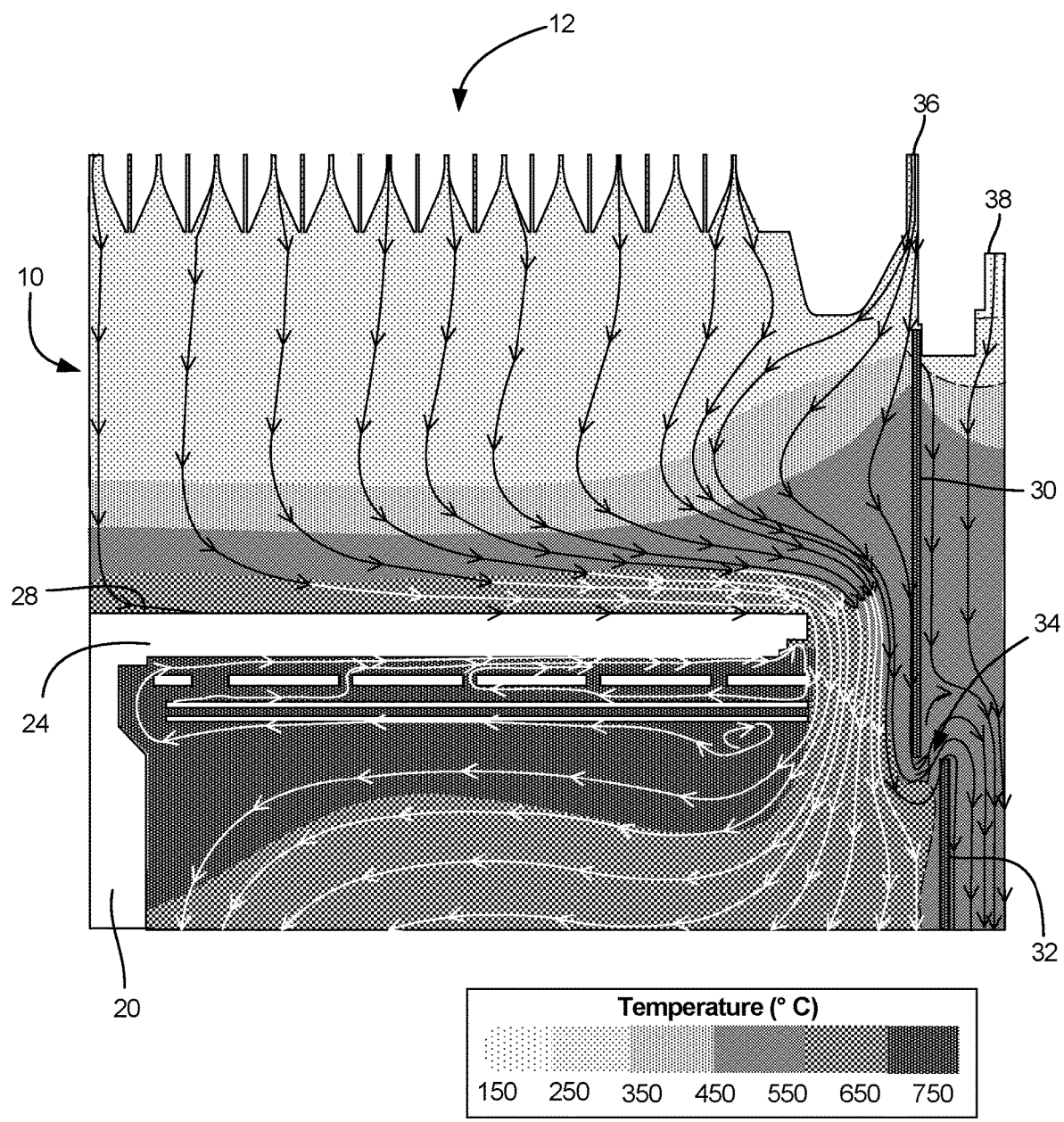

FIGS. 4A and 4B depict temperature profiles across two embodiments. FIG. 4A depicts temperature throughout a system having a vortex V''', whereas FIG. 4B depicts temperature throughout a system without a vortex. As shown in FIGS. 4A and 4B, vortex V''' causes gases having higher temperatures to move back towards the top of reactor chamber 10. That is, vortex V''' redistributes precursor gases that have passed over surface 28 or been heated. Once precursor gases have been sufficiently heated to pyrolyze, it is generally undesirable for those gases to be redistributed back towards the top of reactor chamber 10, because the pyrolyzed gases can deposit on cooler surfaces within reactor chamber 10 and form deposits. Such deposits, as described with respect to FIGS. 6A-6C, for example, can form on surfaces within reactor chamber 10 and then fall onto either wafer carrier 24, reactor chamber 10, or any materials being grown on wafer carrier 24.

Considering the flowpaths shown in FIGS. 3A-3C, 4A, and 4B, it can be seen that a system incorporating upper and lower shutters 30 and 32 defining a gap 34 can be used to cause a flow pattern within reactor chamber 10 that does not result in recirculation of hot, pyrolyzed gases back up towards injector block 12. Furthermore, by introducing peripheral purge flows at inner periphery purge inlet 36 and outer periphery purge inlet, radially inward and radially outward of upper shutter 30, respectively, it is possible to reduce vorticity and recirculation even further. Furthermore, by introducing peripheral purge flow at inner periphery purge inlet 36 that is denser than the precursor gases introduced at injector block 12, vorticity can still further be reduced.

Figure 5:
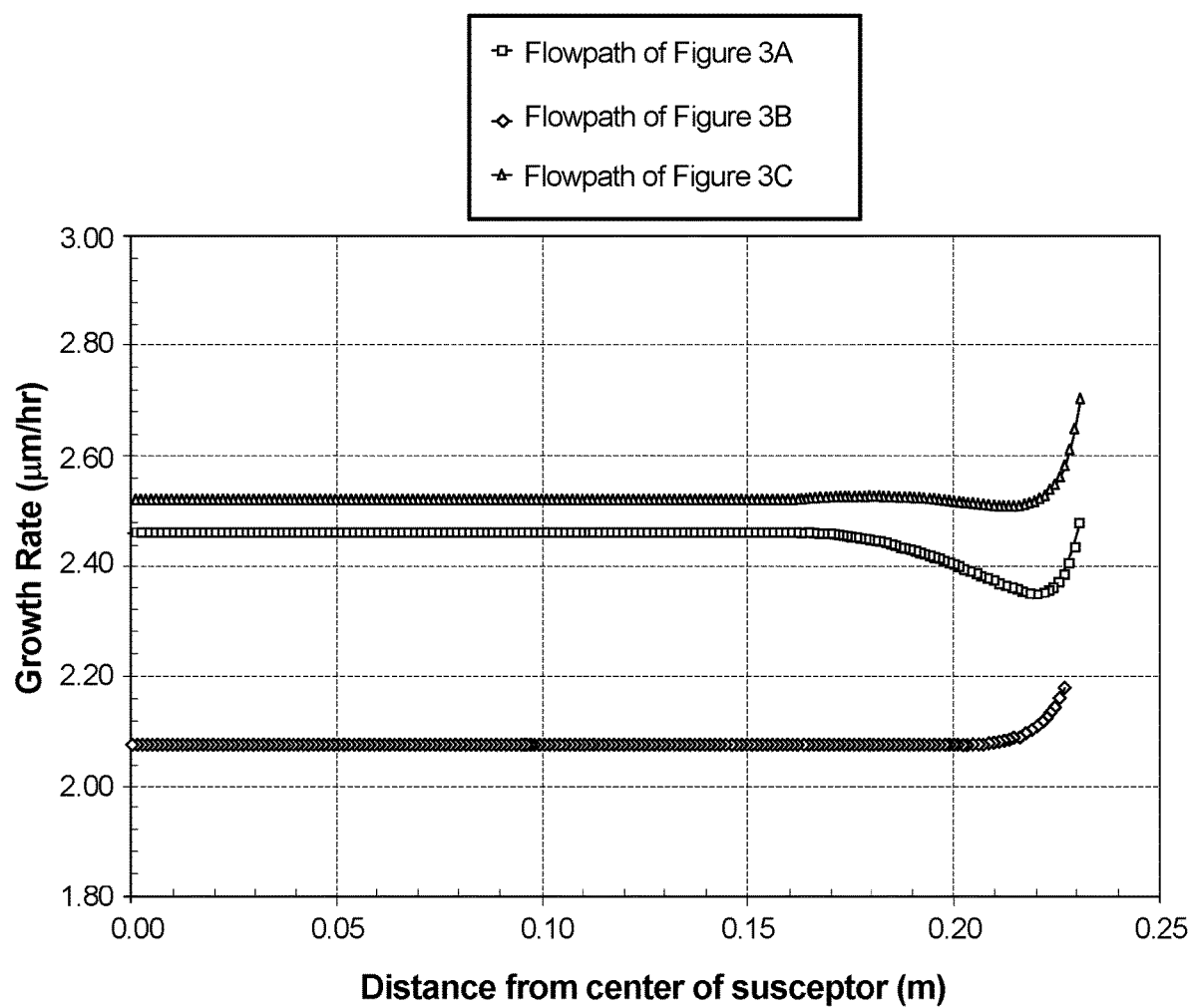
FIG. 5 is a chart depicting growth rates of an epitaxially-grown material, according to the embodiments previously shown in FIGS. 3A-3C.

FIG. 5 illustrates yet another advantage to the embodiments previously described with respect to FIGS. 1-4B. In particular, the growth rate of aluminum gallium arsenic from a mixture of precursor gases including TMAl, TMGa, and arsine is depicted in FIG. 5, for each of the flowpaths previously described with respect to FIGS. 3A-3C.

The flowpath shown in FIG. 3A is that of a 23 slm flow rate at inner periphery purge inlet 36, and 82 slm flow rate at injector block 12. Deposition is fairly even and uniform to about 0.15 m from the center of wafer carrier 24, as a result of the reduced vorticity caused by the arrangement of upper shutter 30 and lower shutter 32, as well as the input of purge gas at inner periphery purge inlet 36 and outer periphery purge inlet 38.

While the deposited structure of flowpath shown in FIG. 3A presents an advantage over conventional systems, the flowpath shown in FIG. 3A still exhibits vorticity. As a result, outward from 0.15 m from the center of wafer carrier 24, deposition becomes uneven. In particular, thickness of deposition decreases steadily from about 0.15 m to about 0.22 m from the center of wafer carrier 24, and then increases rapidly.

FIG. 3B, in which flow rates through both inner periphery purge inlet 36 and injector block 12 have been increased substantially, reduces vorticity within reactor chamber 10 and accordingly reduces the extent of the groove. The input rates of precursor gases in the embodiment shown in FIG. 4B are 100 slm at injector block 12, and 27 slm at inner periphery purge inlet 36.

As might be expected, FIG. 5 shows that the growth rate associated with the inputs of FIG. 3B are lower than those associated with the inputs of FIG. 3A. Furthermore, due to reduced vorticity, the radially outer edge shape is different in FIG. 3B than it was in FIG. 3A. In particular, in FIG. 3B, substantially flat deposition occurs across a larger part of the wafer carrier. Whereas flat deposition occurred to only about 0.15 m from the center of wafer carrier 24 for the flowpath shown in FIG. 3A, flat deposition occurs to about 0.2 m in the flowpath shown in FIG. 3B.

FIG. 3C shows a flowpath with even smaller vorticity than those of FIGS. 3A and 3B, and the growth rates associated with FIG. 3C, as depicted in FIG. 6, are more even as a result. In the line associated with the flowpath of FIG. 3C, uniform growth rate extends past 0.21 m from the center of wafer carrier 24, and there is no "groove" at all.

Figure 6A:
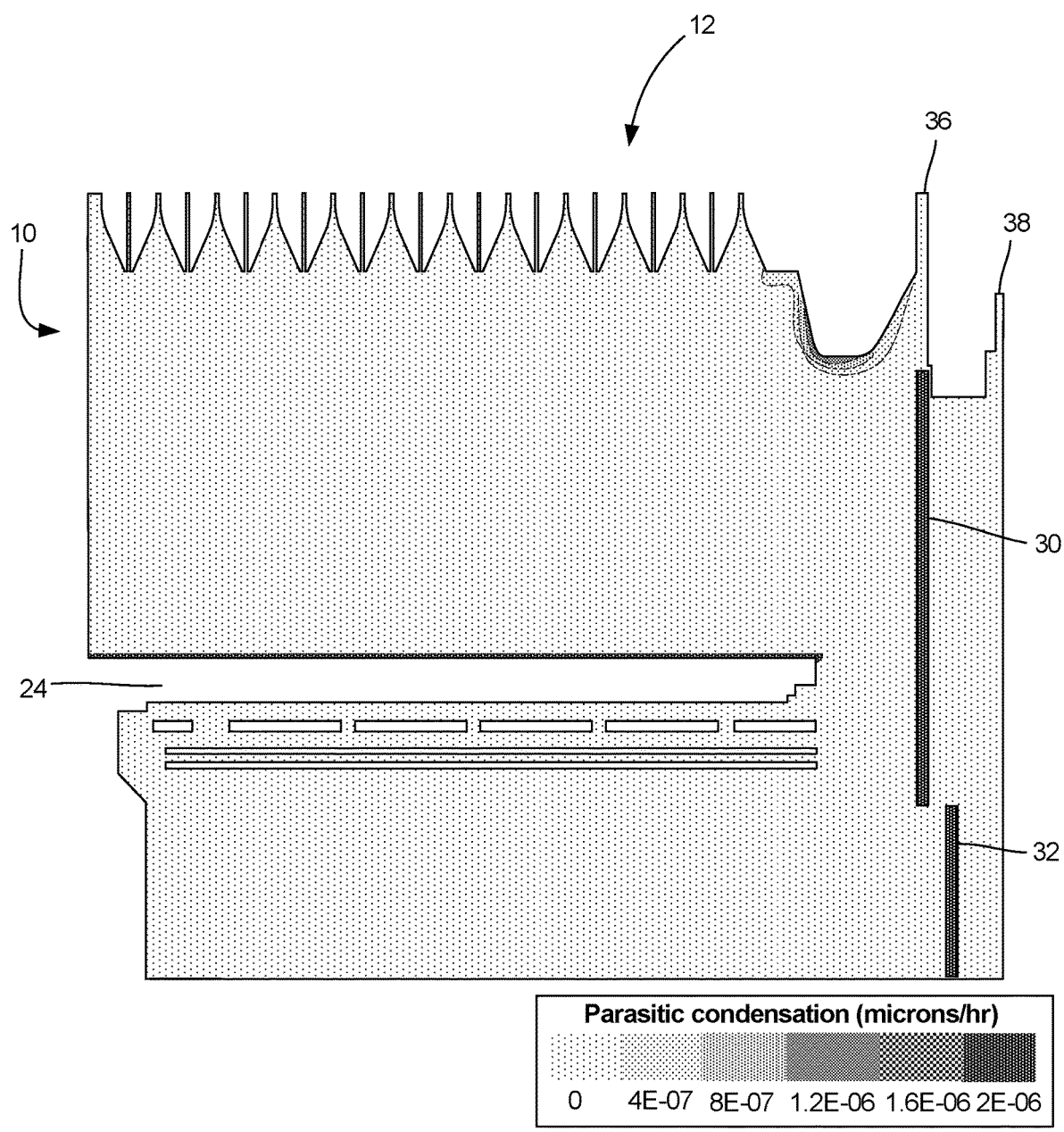
FIGS. 6A-6C are cross-sectional views depicting deposition of pyrolyzed material at the upper edge of the reactor, according to three embodiments.
Figure 6B:
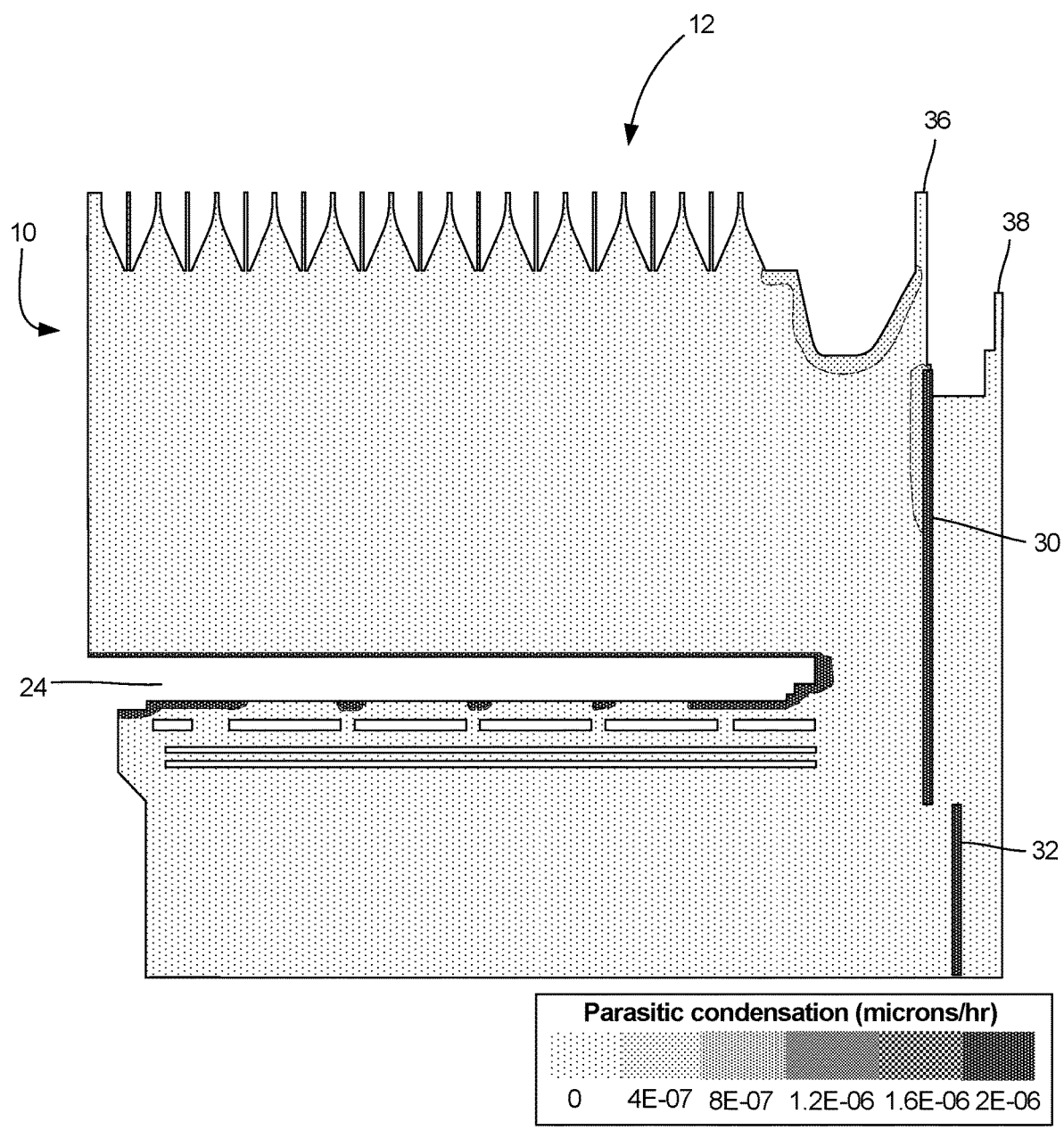
Figure 6C:
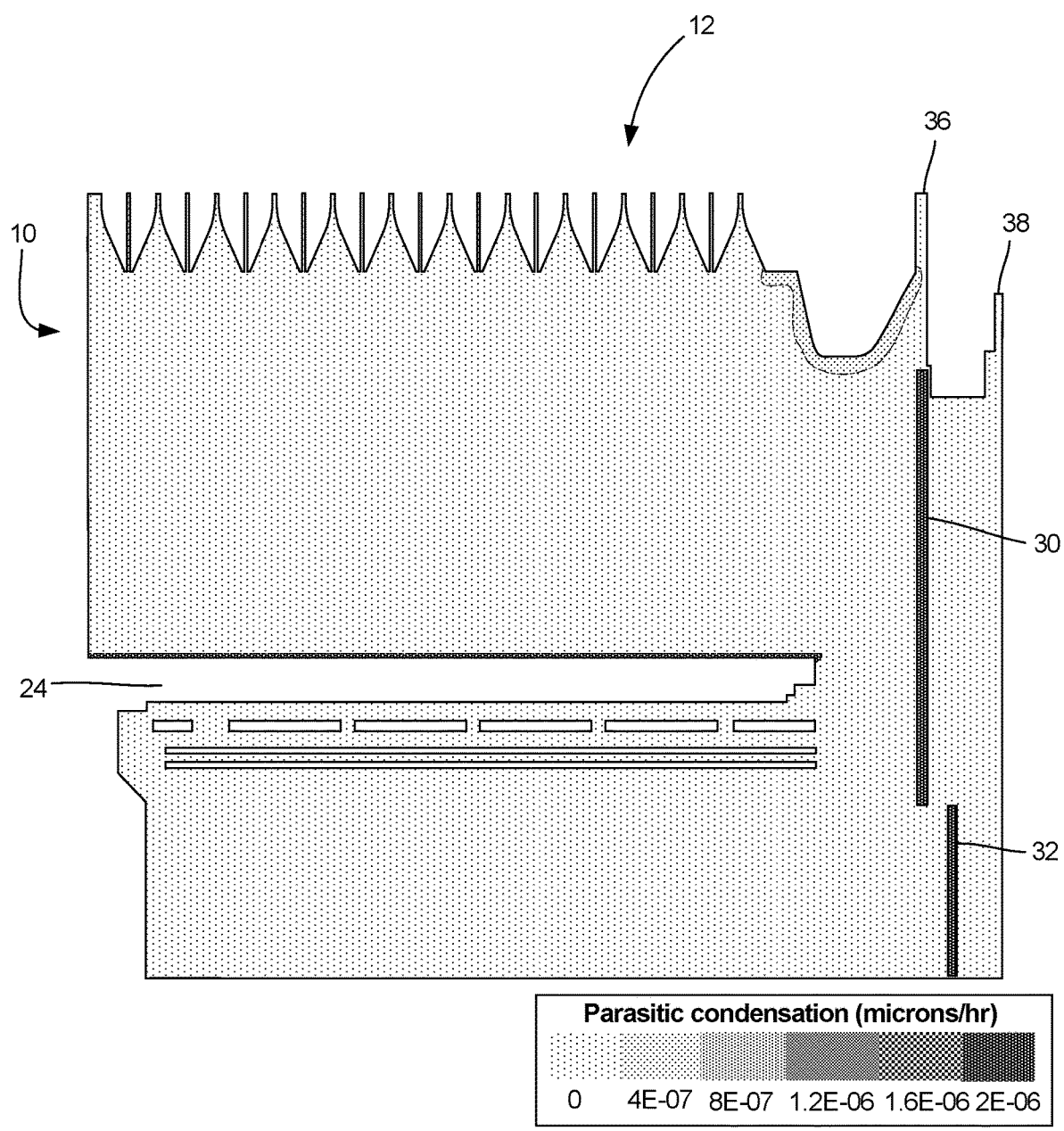

FIGS. 6A-6C depict deposits within reactor chamber 10 associated with the flowpaths shown in FIGS. 3A-3C, respectively. In particular, deposits are shown at the upper surface of reactor chamber 10, adjacent to inner periphery purge inlet 36 and injector block 12.

Such deposition can be the result of vorticity, which brings precursor gases that have been pyrolyzed at the relatively hotter bottom of reactor chamber 10 back up towards the top of reactor chamber 10 (as shown in FIGS. 4A and 4B). Due to the reductions in vorticity associated with the flowpaths of FIGS. 3A-3C, very little deposition occurs at the upper surface of reactor chamber 10 in these embodiments. Deposition on the upper surface decreases with smaller vortices (e.g., V, V', V", V'").

Figure 7A:
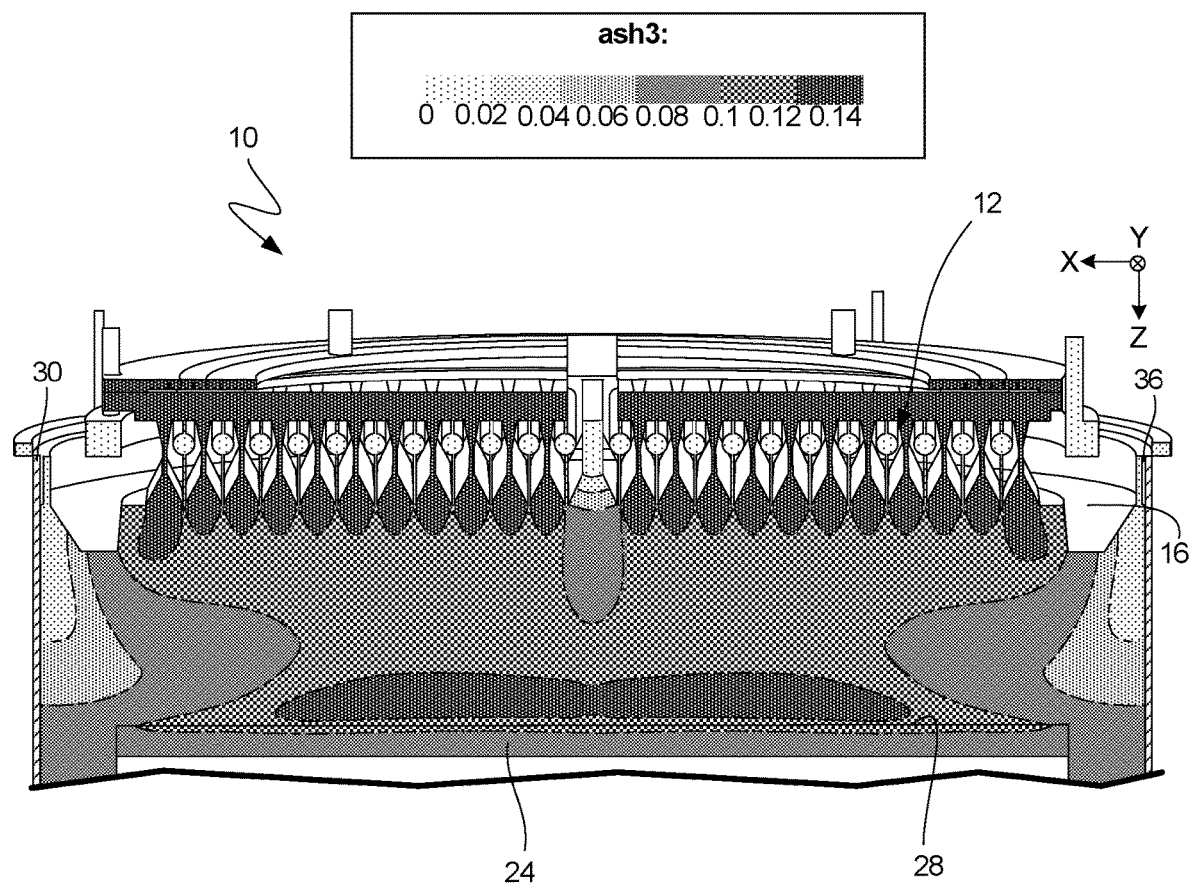
FIGS. 7A and 7B are charts depicting arsine levels in a reactor chamber according to two embodiments.
Figure 7B:
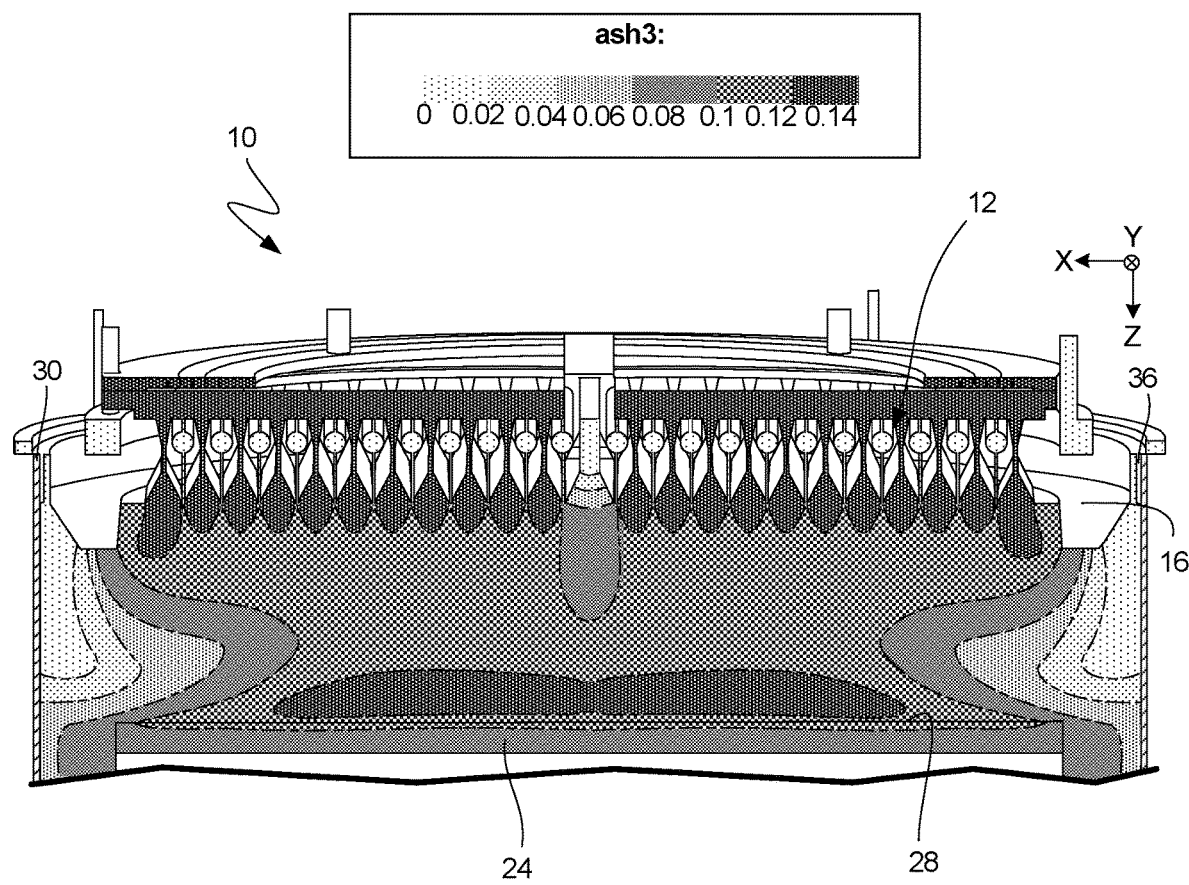

FIGS. 7A and 7B depict the arsine ratio within a reactor chamber 10, according to two embodiments. In the first embodiment, shown in FIG. 7A, inner periphery purge inlet 36 provides a flow of precursor gas that has a first level of arsine, and in FIG. 7B, inner periphery purge inlet 36 provides a flow of precursor gas that has a second level of arsine that is lower than that depicted in FIG. 7A. For example, in FIG. 7B, there may be an added heavier component, such as that described previously with respect to FIG. 3C.

Figure 8:
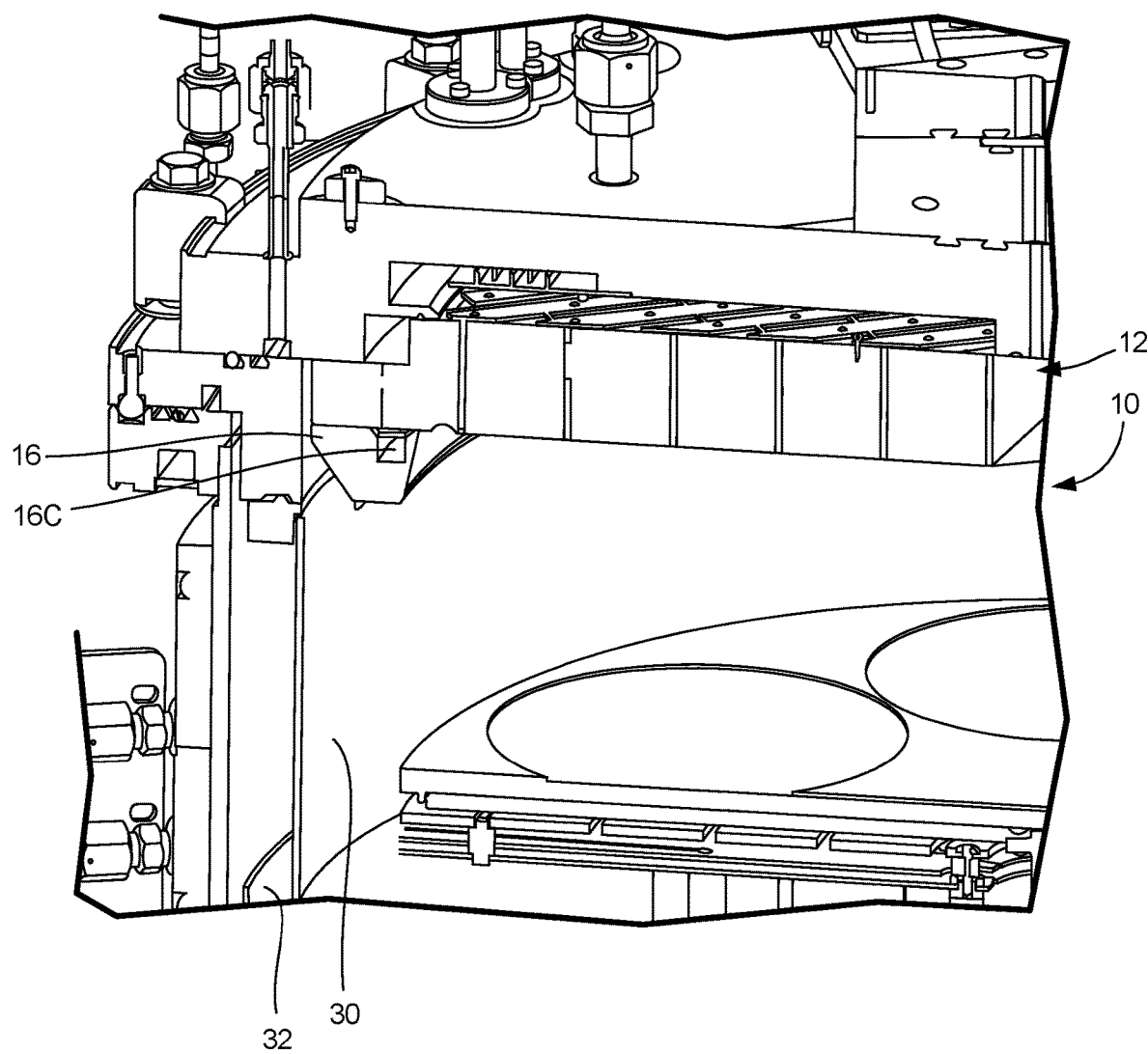
FIG. 8 is a perspective cross-sectional view of a coolant system according to an embodiment.

FIG. 8 is a cut-away perspective view depicting coolant system 16. As shown in FIG. 8, coolant system 16 is positioned at the upper portion of reactor chamber 10, extending radially about injector block 12. Coolant system 16 defines a channel 16C, which extends throughout coolant system 16 and can be used to route a cooling fluid through coolant system 16 to reduce its temperature, in embodiments.

Figure 9A:
FIGS. 9A and 9B are cross-sectional views of coolant systems, according to two embodiments.
Figure 9B:
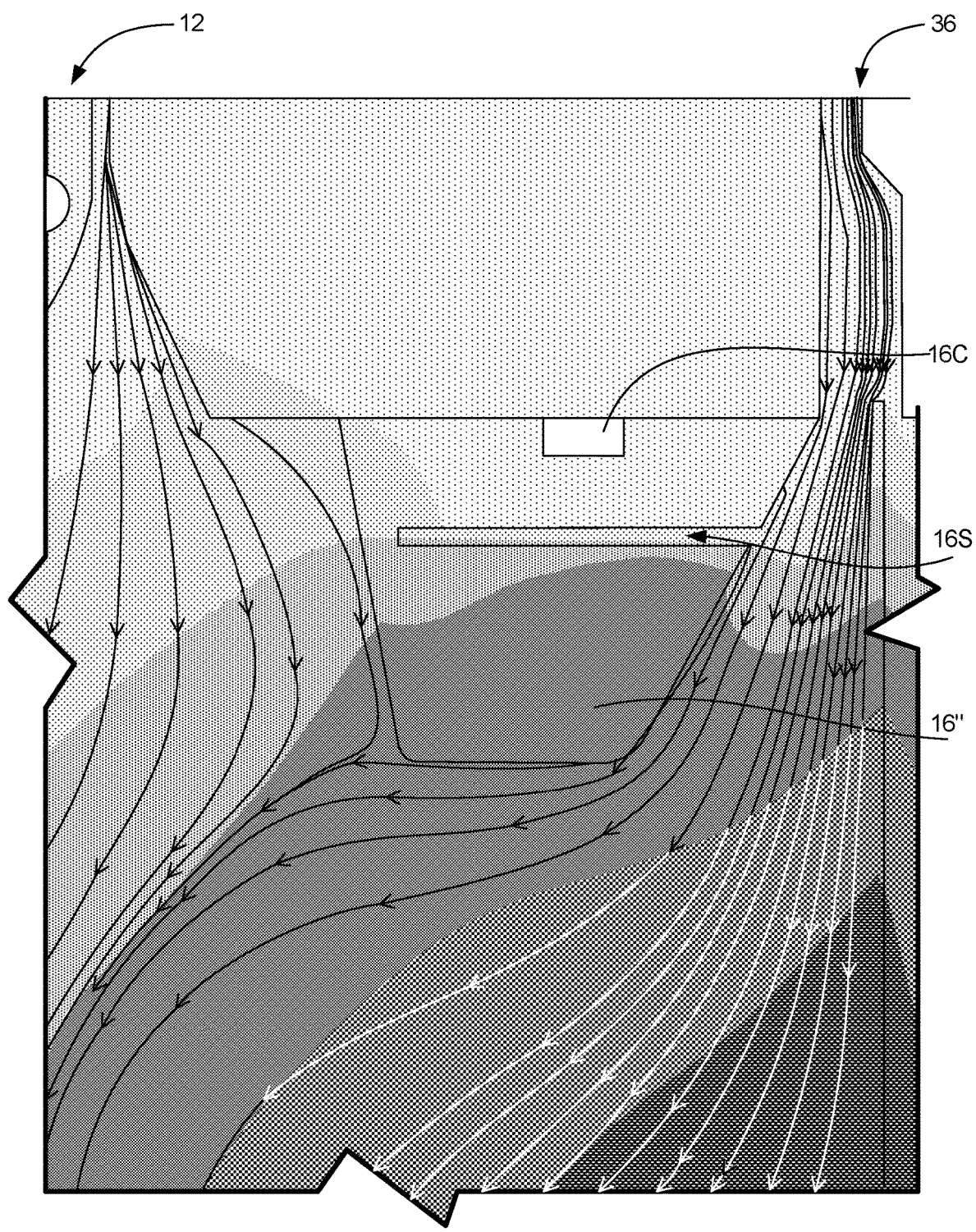

FIGS. 9A-9B are cross-sectional views of coolant systems 16' and 16", respectively, according to two embodiments. FIG. 9A depicts coolant system 16', which includes channel 16C as previously described. FIG. 9A illustrates the temperature gradient across coolant system 16', when coolant is routed through channel 16C.

In general, it is desirable to limit the temperature of reactor housing 10 at injector block 12. If injector block 12 becomes too hot, precursor gases routed through it may pyrolyze earlier than desired. Thus, as previously described with respect to FIGS. 4A and 4B, it is generally desirable to produce a temperature gradient between injector block 12, which should be relatively cool, and wafer carrier 24, which should be hot enough to pyrolyze the precursor gases and cause epitaxial growth.

While coolant system 16' provides some thermal protection for injector block 12 and promotes such a gradient, in embodiments it may be desirable to increase the temperature gradient to a greater extent adjacent to injector block 12. As shown in FIG. 9B, coolant system 16" includes not only channel 16C, but also slit 16S. Slit 16S prevents thermal transfer from the lower portion to the upper portion of coolant system 16". As shown in shading in FIG. 10B, this causes a temperature discontinuity at slit 16S, with the portion above slit 16S cooler than the portion below slit 16S.

In alternative embodiments, other features such as multiple cooling channels, fins, additional slits, or alternative geometries of coolant system 16 can be used. In combination with other features described previously for reducing vorticity within reactor chamber 10, injector block 12 can be kept at a relatively low temperature. These aspects are often complimentary to one another, as coolant system 16 can be chilled to a lower temperature when there is no vortex V.

Figure 10:
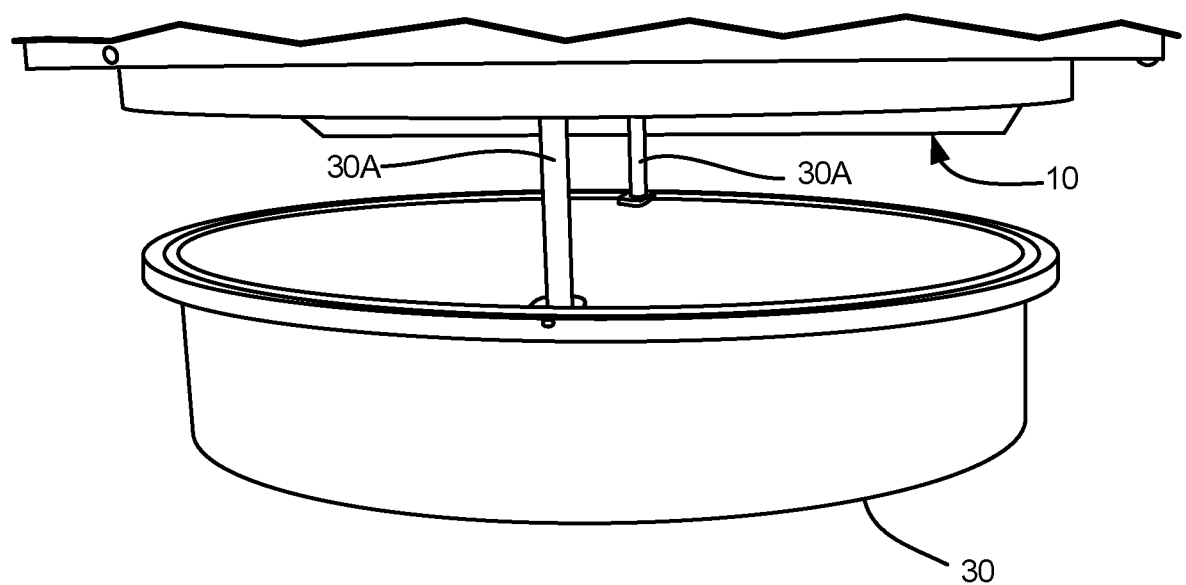
FIG. 10 is a perspective view of a peripheral shutter dropped out of the reactor chamber, according to an embodiment.

FIG. 10 is a perspective view of upper shutter 30, dropped out of reactor chamber 10. In embodiments, upper shutter 30 can be attached to reactor chamber 10 via arms 30A. When repair, maintenance, or replacement is desired, upper shutter 30 can drop down from reactor chamber 10. As compared with conventional systems, this facilitates simple maintenance of reactor chamber 10.

Various embodiments of systems, devices, and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112(f) of 35 U.S.C. are not to be invoked unless the specific terms "means for" or "step for" are recited in a claim.

The invention claimed is:

1. A reactor for use with a chemical vapor deposition (CVD) system, the reactor comprising:
    a susceptor extending radially outward from an axis;
    a wafer carrier removably mounted on the susceptor, the wafer carrier having a top surface;
    an injector block configured to provide a precursor gas flow to the top surface;
    an upper shutter arranged radially outward from the susceptor and extending parallel the axis from the injector block to the top surface;
    an inner periphery purge inlet arranged between the upper shutter and the injector block and configured to provide a peripheral gas flow;
    a lower shutter arranged radially outward from the upper shutter and extending parallel the axis from the upper shutter away from the injector block; and
    wherein a bottom edge of the upper shutter and a top edge of the lower shutter define a gap in fluid communication with an outer periphery purge inlet arranged radially outward from the upper shutter,
    wherein at least at least a portion of the peripheral gas flow exiting the inner periphery purge inlet flows around a radially inner bottom edge of the upper shutter and through the gap to the outer periphery purge inlet.

2. The reactor of claim 1, wherein the inner periphery purge inlet is configured to provide the peripheral gas flow along a radially inner edge of the upper shutter.

3. The reactor of claim 2, and further comprising a periphery purge outlet arranged radially outward of the lower shutter.

4. The reactor of claim 1, and further comprising a coolant system thermally coupled with the injector block.

5. The reactor of claim 4, wherein the coolant system comprises a channel.

6. The reactor of claim 4, wherein the coolant system comprises a slit.

7. The reactor of claim 2, wherein a carrier gas component of the precursor gas flow is a different composition than a carrier gas component of the peripheral gas flow.

8. The reactor of claim 7, wherein the carrier gas component of the peripheral gas flow is denser than the carrier gas component of the precursor gas flow.

9. The reactor of claim 7, wherein the carrier gas component of the peripheral gas flow includes more nitrogen than the carrier gas component of the precursor gas flow.

* * * * *